US007825749B2

(12) United States Patent
Thalhammer et al.

(10) Patent No.: US 7,825,749 B2

(45) Date of Patent: Nov. 2, 2010

(54) INTEGRATED COUPLED RESONATOR FILTER AND BULK ACOUSTIC WAVE DEVICES

(75) Inventors: Robert Thalhammer, Munich (DE); Martin Handtmann, Munich (DE); Jyrki Kaitila, Riemerling (DE)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 138 days.

(21) Appl. No.: 11/756,583

(22) Filed: May 31, 2007

(65) Prior Publication Data

US 2008/0297280 A1 Dec. 4, 2008

(51) Int. Cl.
*H03H 9/60* (2006.01)
*H01L 41/22* (2006.01)

(52) U.S. Cl. .................................... 333/189; 333/133

(58) Field of Classification Search ................ 333/133, 333/186, 187, 189
See application file for complete search history.

(56) References Cited

U.S. PATENT DOCUMENTS

| | | | | |
|---|---|---|---|---|
| 5,910,756 | A * | 6/1999 | Ella | 333/133 |
| 6,204,737 | B1 * | 3/2001 | Ella | 333/187 |
| 6,720,844 | B1 | 4/2004 | Lakin | |
| 6,741,146 | B2 * | 5/2004 | Ella | 333/133 |
| 7,057,478 | B2 * | 6/2006 | Korden et al. | 333/189 |
| 7,212,083 | B2 * | 5/2007 | Inoue et a | 333/189 |
| 7,212,085 | B2 * | 5/2007 | Wu | 333/189 |
| 7,436,269 | B2 * | 10/2008 | Wang et al. | 333/133 |
| 2002/0089393 | A1 | 7/2002 | Tikka | |
| 2004/0046622 | A1 | 3/2004 | Aigner et al. | |
| 2006/0119453 | A1 | 6/2006 | Fattinger et al. | |
| 2006/0232361 | A1 | 10/2006 | Wang et al. | |

FOREIGN PATENT DOCUMENTS

| | | | |
|---|---|---|---|
| EP | 1 317 797 | B1 | 6/2003 |
| EP | 1 464 113 | B1 | 10/2004 |
| WO | WO 03/058811 | A1 | 7/2003 |

OTHER PUBLICATIONS

Wu, Tsung-Ying , "Single-To-Balanced BAW Tilter Combining CRF with Lattice Filter", *IEEE Ultrasonics Symposium* 2005, 2190-2193.
Lakin, K.M., et al., "Wide Bandwidth Thin Film BAW Filters," IEEE Ultrasonics Symposium, vol. 1, Aug. 2004, 4 pages.
Lakin, K.M., "Thin Film BAW Filters For Wide Bandwidth And High Performance Applications," IEEE MTT-S International, Microwave Symposium Digest, vol. 2, Jun. 2004, pp. 923-926.

* cited by examiner

*Primary Examiner*—Vibol Tan
*Assistant Examiner*—Crystal L Hammond

(57) ABSTRACT

A method for manufacturing a filter device is provided. The filter device comprises a coupled resonator at a first site, a shunt resonator at a second site and a series resonator at a third site, the coupled resonator comprising a first and a second resonator. The method comprising a step of providing a substrate with a piezoelectric layer sandwiched between a first electrode and a first part of a second electrode at the first site and the second site, the piezoelectric layer sandwiched between the first electrode and a second part of the second electrode at the third site. The method further comprising the step of forming a coupling layer on the second electrode, the step of forming a further piezoelectric layer sandwiched between a further first electrode and a further second electrode at the third site and the step of removing the coupling layer at the second and third sites.

8 Claims, 14 Drawing Sheets

INTEGRATED COUPLED RESONATOR FILTER AND BULK ACOUSTIC WAVE DEVICES

BACKGROUND

The present invention relates to the field of integrated coupled resonator filter devices using bulk acoustic wave structures and their integration in a substrate.

SUMMARY OF THE INVENTION

Embodiments of the present invention comprise a method for manufacturing a filter device, which comprises a coupled resonator at a first site, a shunt resonator at a second site and a series resonator at a third site, the coupled resonator comprising a first and a second resonator. The method comprising a step of providing a substrate with a piezoelectric layer sandwiched between a first electrode and a first part of a second electrode at the first site and the second site, the piezoelectric layer sandwiched between the first electrode and a second part of the second electrode at the third site. The method further comprising the step of forming a coupling layer on the second electrode, the step of forming a further piezoelectric layer sandwiched between a further first electrode and a further second electrode at the third site and the step of removing the coupling layer at the second and third sites.

BRIEF DESCRIPTION OF THE DRAWINGS

Features of the embodiments of the invention will be more readily appreciated and better understood by reference to the following description, which should be considered with reference to the accompanying drawings in which.

Figure 1:
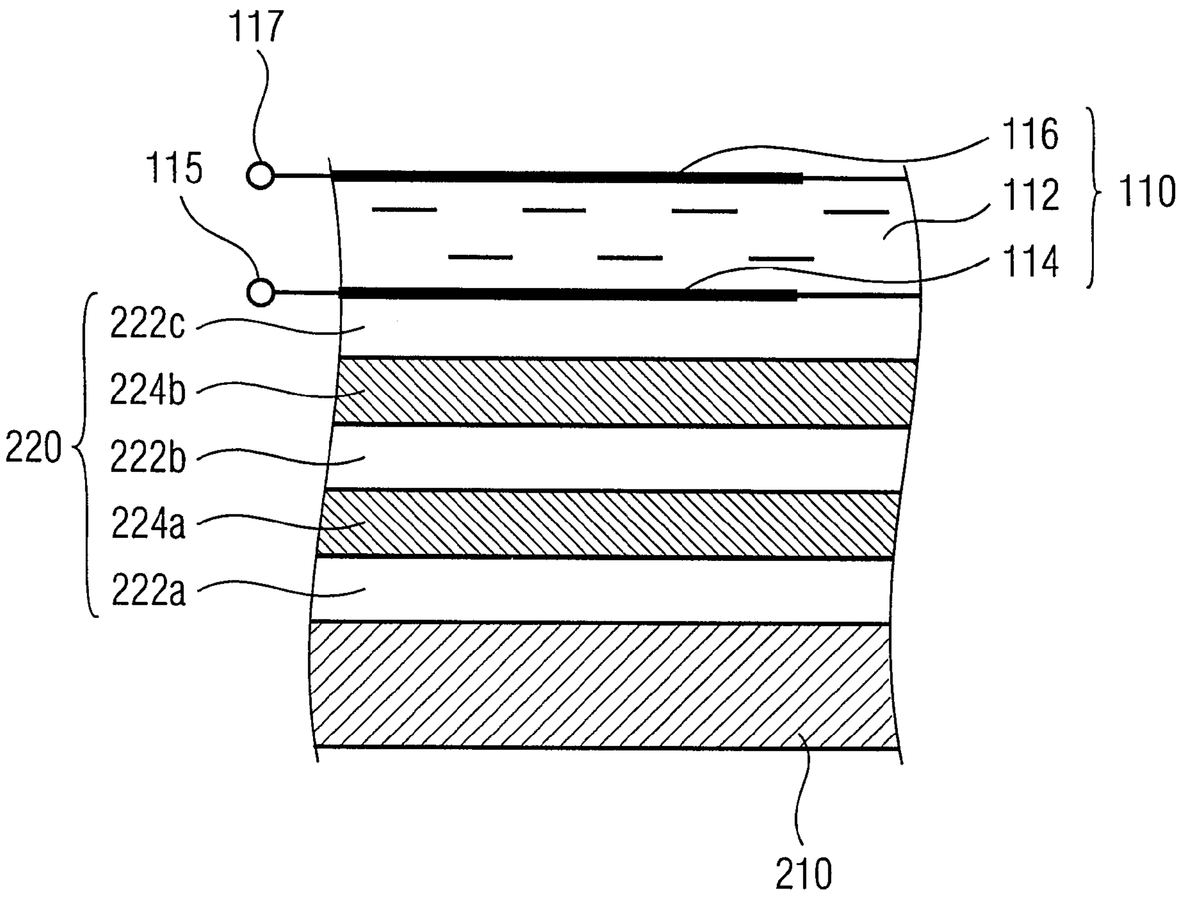
FIG. 1 shows a conventional BAW resonator.

Before embodiments of the present invention are explained in more detail below with reference to the drawings, it should be noted that equal elements and those operating in an equal way are provided with the same or similar reference numerals in the figures, and that a repeated description of these elements is omitted.

DETAILED DESCRIPTION OF ILLUSTRATIVE EMBODIMENTS

Conventional filter technologies, which, for example, are used in mobile applications for a frequency range of 1 to 10 Gigahertz use, for example, surface acoustic wave (SAW) resonators or ceramic filters. A promising candidate for replacing these old filters are BAW (bulk acoustic wave) resonators. A typical BAW resonator comprises a piezoelectric layer sandwiched between two electrodes. An acoustic isolation from a substrate can be achieved either by creating an interface on both sites of the BAW resonator (and hence is also denoted by a membrane device) or by applying an acoustical mirror between the BAW resonator and the substrate. The latter one being the so-called solidly-mounted resonator (SMR). The acoustical mirror is typically composed of alternating high and low acoustical impedance materials providing good reflection of acoustic waves at an intended operation frequency. There are also various methods of producing a membrane device, either by surface or by bulk micromachining.

A coupled resonator filter (CRF) is a BAW device utilizing two piezolayers or piezoelectric layers and four electrodes, wherein each of the two piezolayers is sandwiched by two electrodes, or equivalently a CRF comprises a stacked arrangement of two BAW resonators, which will also be referred to simply as resonators. The electrodes can be constructed of two or more materials so that a higher electromechanical coupling coefficient of the resulting resonator enables a larger filter bandwidth. The two resonators (stacked BAW resonators) can be acoustically partially decoupled from each other by placing a series of layers comprising alternating high and low impedance materials between the two resonators. By changing the number of layers, their composition and/or their thickness the acoustic coupling between the resonators can be tuned to a desired value. When the coupling comprises the desired or right value, the resulting device is operating in a so-called critical coupled mode and exhibits a right pass band.

An acoustical isolation from a substrate, on which the CRF can be formed, can be achieved as for the BAW resonators by either creating an air interface on both sites, a bottom and upper site of the CRF or by applying an acoustical mirror between the CRF and the substrate—the latter one referring to the above-mentioned solidly-mounted CRF. A main benefit of the CRF as compared to traditional resonators based filters (for example, single piezo layer devices), is a smaller size and better stop band performance as well as a possibility for a mode conversion, for example a single-to-balanced conversion. Traditional resonator based filters are, for example, the so-called ladder or lattice type filters.

Furthermore, these devices can be operated in a single-to-single, single-to-balanced or fully balanced modes. However, this device suffers from relatively poor transition band (filter skirt) characteristics. Some mobile technologies such as various GSM bands, require, however, that the filter makes transition in narrow regions, which are, for example, as small as 10 to 20 Megahertz from pass band to stop band characteristics. The wide transition bandwidth of the CRF comprises a basic property of a traditional CRF and nothing in the basic configurations enables to enhance this transition band property.

It is known that the performance of the CRF can be further enhanced by combining the CRF with a traditional ladder circuitry utilizing traditional, for example, single piezolayer-BAW devices. Beneficially, the steep transition bands of a traditional ladder filter can be combined with the excellent stop band, pass band and mode conversion characteristics of the CRF.

Therefore, there is a need to provide an improved CRF, which is combined with a traditional thin film BAW structure (e.g., traditional BAW resonators) providing superior performance compared to traditional or existing solutions and especially there is a need for a monolithical integration of such a device.

Embodiments of the present invention provide means to monolithically integrate the CRF and a ladder or lattice type circuitry on a single substrate. Therefore, embodiments provide a combined device exhibiting superior performance on a small area, and furthermore, embodiments show a process flow that achieves this with minimal effort, meaning a minimum number of mask layers and other process steps.

In order to realize the two devices on the same substrate, one of the resonators constituting the CRF can be removed and used in lattice or ladder type circuitry. Furthermore, the so-called coupling layers between the two resonators of the CRF can be removed. Finally, in ladder or lattice circuitry there are two types of devices called series and shunt resonators operating at slightly different frequencies and, hence, a method for the corresponding detuning should be provided. A method to do this is to mass load the shunt resonators with the thin layer to shift the resonance frequency down or, alternatively, to remove a layer (or part of a layer) on series resonators to shift their frequency up.

There are, however, multiple ways of doing this, if few offer the best possible benefits regarding an optimum performance, manufacturing simplicity and process stability. Hence, embodiments of the present invention provide a process that utilizes a minimum number of process steps to achieve the objectives.

There are two basic cases that can be envisioned: the first one will provide direct electrical contact only to one of the electrodes of the traditional resonator—e.g., as part of the ladder filter—which would typically the top electrode (where top refers to the direction facing off the substrate). Circuits realized with this scheme comprise some limitations since no vias exists through the lower piezolayer. This means that circuits comprising single ladder sections before and/or after (referring to a direction of a possible signal transmission) the CRF are possible, as well as having these single ladder sections in between any CRF stages.

A second case is the one in which access to the lowest electrode is also provided (the lowest electrode is typically formed on the substrate). Since all layers are now accessible from the top, and any connections between the four distinct electrodes are possible, any circuitry having CRFs and transitional BAWs can be constructed.

Here, and in the following, lower refers to closer to the substrate in contrast to upper referring to further separated from the substrate.

One of the technological constraints that enter the picture in realizing such structures is to maintain substrate planarity at some key process steps. Most notably, it is desirable to perform the deposition of the piezolayers on planar surfaces. This is important, because this directly influences the quality of the resulting layers. Therefore, it appears that the best way of realizing the structures is to use the lower resonator of the CRF, which is the closest to the substrate, as the building block for the traditional BAWs. This is possible, and enabled by a process flow according to embodiments of the present invention. In conventional process flows the top resonator is used as a building block for the traditional BAWs. In this case, the deposition of the piezolayers is also performed on planar surfaces, but a most notable disadvantage is that the resulting resonators suffer from reduced coupling and/or Q-values. Since the resonators in embodiments of the present invention are directly built on the acoustic mirror with no additional layers either in between the mirror and the resonator and/or on top of the resulting resonators, the resonators are expected to function in line with their traditional counterparts that means with optimum coupling and high Q-values.

The structure according to embodiments is described with the aid of three examples that provide a framework around which other similar processes can be based and just show the logic of attaining the desired result. There are multiple ways of achieving the stated goal to provide superior performance on a small area and the examples provided here should be understood as examples only, not covering all the possible methods of achieving the stated goal.

For clarity, references to the electrodes in the structure will be defined as follows (without explicit assignment to a particular mask layer by which the electrode is actually structured):

BOTE1=Bottom electrode of the lower resonator;

TOPE1=Top electrode of the lower resonator;

BOTE2=Bottom electrode of the upper resonator; and

TOPE2=Top electrode of the upper resonator, wherein as mentioned already before, top and bottom refers to the direction pointing to and away from the substrate.

The first example comprises a process flow achieving a monolithically integrated BAW-CRF device without connections to the lowest electrode (BOTE1) of the structure.

The starting point is a structure after the mirror layers in the substrate and the bottom electrode layers (BOTE1) have been deposited, structured and planarized. In addition, the bottom piezolayers has been deposited and the top electrode of the bottom resonator (TOPE1) of the CRF has been structured. The structuring of the bottom and top electrodes is done in a way that the sites where the resulting series and shunt resonators of the ladder or lattice section and the CRF are to be formed are identified. As a next step, the coupling layers of the CRF are deposited, patterned and planarized, which involves multiple steps that can be, for example, performed in the following sequence:

1. Deposit a planarization layer (e.g., comprising $SiO_2$) for the top electrode, that means the thickness of the $SiO_2$ is preferably the same as the step height of the etched top electrode plus any possible etching in the piezolayers.

2. Structure the $SiO_2$ leaving only narrow fences extending on top of the electrode.

3. Planarize the remaining fences using, for example, CMP (Chemical Mechanical Polishing).

4. Deposit a first (lower) coupling $SiO_2$ layer.

5. Deposit a coupling tungsten layer.

6. Pattern and planarize the coupling tungsten layer (similar to steps 1-3).

7. Deposit a second (upper) coupling $SiO_2$.

8. Deposit a lower electrode of the upper CRF resonator.

9. Pattern the lower electrode of the upper CRF resonator.

After performing these steps, the coupling layers of the CRF are not present in the resulting structure on the sites, where the traditional resonators will be formed—the stack above these traditional resonators at this point or this site comprises only silicon oxide. This is achieved, for example, by a proper mask layout for structuring the coupling layers and does not require any additional process steps.

The materials tungsten and silicon oxide used in this process are only examples for materials of high and low acoustic impedances that can be used. In further embodiments other materials are used. Possible materials for layers with high acoustic impedance comprise, for example, W, Mo, Pt, Ta, TiW, TiN, Ir, WSi, Au, $Al_2O_3$, SiN, $Ta_2O_5$ and Zirkon-oxide, wherein the last four are dielectric materials. Possible materials for the piezoelectric layers are, for example, AlN, ZnO, PZT and $LiNbO_3$. A further material for lower acoustic impedance is, for example, aluminum.

In the following step the bottom electrode (BOTE2) is planarized, for example, in a similar manner as before, and a piezolayer of the upper resonator of the CRF is deposited and patterned. Next, the top electrode of the top CRF resonator (TOPE2) is formed and subsequently the silicon oxide layer on top of the traditional BAWs is removed.

Finally, it is necessary to shift the resonant frequency of the shunt resonators by detuning and, in addition, possibly shifting the resonant frequency of both the series and shunt resonators to meet a target frequency. A possibility of achieving this is either by adding or removing material from these resonators (for example, from the top electrode). Optionally, additional layers for controlling the so-called spurious modes and passivation of the device may be added.

It should be noted that this simple process does not provide many electrical connections that would in some cases be beneficial. The only possible connections are the trivial ones:

1. BOTE1-BOTE1,
2. TOPE1-TOPE1,
3. BOTE2-BOTE2, and
4. TOPE2-TOPE2, wherein the electrodes refer to different BAW resonators that are formed at different sites along the common piezo layer. The electrodes are obtained, for example, by patterning of one single electrode layer (e.g., TOPE1 can comprise electrically disconnected part).

By adding an additional metal layer after the step of detuning the series and shunt resonators, it is possible to include either a connection TOPE1-BOTE2 and/or a connection TOPE1-TOPE2, which can allow more advanced circuitry. This requires an additional layer, which, however, can be overcome by the next example.

The second example gives a further process flow according to embodiments of the present invention, which is similar to the first example up to the deposition of the upper piezolayers. The starting point of this example differs from the first example in that the upper electrodes (TOPE1) of the traditional BAWs are not present when the silicon oxide layer and subsequently the upper piezo layer are formed (e.g., by changing the mask layout for structuring the TOPE1 electrode). This example highlights the fact that when, later in the process, the electrode TOPE2 is structured it would be difficult to achieve etching selectivity between TOPE2 and TOPE1, that necessarily would be exposed on the surface at that time.

Instead of depositing the TOPE2 electrode of the CRF at this point, the piezolayer and the thick coupling oxide on top of the traditional BAWs is etched. At the same time, connections to the BOTE2 can be opened, if sufficient etching selectivity can be obtained.

As a next step, after deposition and patterning of the TOPE2 electrode has been performed, it should be noted that the top electrode of the traditional BAWs (TOPE1) can be now formed from the material of the top electrode of the upper resonator of the CRF (TOPE2). At the same time, connections between the top electrode of the traditional BAWs and the top electrode of the CRF top resonator can be formed. Therefore, the additional layer as was the case in the first example, are not needed. After this, the process is the same as for the first example.

In a third example, even more functionality can be gained by a patterning of both of the piezolayers. In this case, topologies requiring connections to the lowest electrode are possible. In this case, the starting point comprises a structure with a lower piezoelectric layer, a top electrode for the lower resonator of the CRF, the coupling layers, the bottom electrode of the upper resonator of the CRF and the upper piezoelectric layer. In a next step, both piezolayers are patterned, top electrodes are deposited and formed simultaneously as was the case in the second example for both the upper resonator of the CRF (TOPE2) and the traditional resonators (TOPE1). There are many possible connections between the different electrodes that are possible—some of them will be discussed in more detail below.

In summary, the essence of all the previous examples is to use the lower piezolayer of the CRF stack for construction of the traditional BAW resonators. The main benefits as described before can be summarized as follows:

1. The possibility to achieve an optimum performance of both resonator types (traditional BAW and CRF) with minimum processing effort;

2. The ability to construct any circuit topology. The process chosen should reflect the complexity requirements, for example, if access to the lowest electrode is not needed, the variants described in the first and second examples can be used. Otherwise, a variant of the third example (or something similar) can be resorted to; and 3. The properties of the resulting single resonators should be equal to standard BAWs (which in essence they are). This means that the coupling coefficient and the Q-values of these resonators can be optimized.

FIG. 1 shows a conventional BAW resonator with a piezoelectric layer 112, a first electrode 114 with a first terminal 115 and a second electrode 116 with a second terminal 117. The first electrode 114 and the second electrode 116 are formed, at least partially, on two opposite sides of the piezoelectric layer 112. The BAW resonator shown in FIG. 1 is a so-called solidly mounted resonator (SMR), which implies that the resonator 110 is formed on a substrate 210 with an acoustic mirror 220, wherein the acoustic mirror 220 comprises a layer assembly. The layer assembly comprises layers of alternating higher and lower acoustic impedances, so that a first layer of low acoustic impedance 222*a* is formed on the substrate 210, a first layer of high acoustic impedance 224*a* is formed on the layer with low acoustic impedance 222*a*, followed by a second layer of low acoustic impedance 222*b*, followed by a second layer of high acoustic impedance 224*b* and, finally, followed by a third layer of low acoustic impedance 222*c*.

Figure 2A:
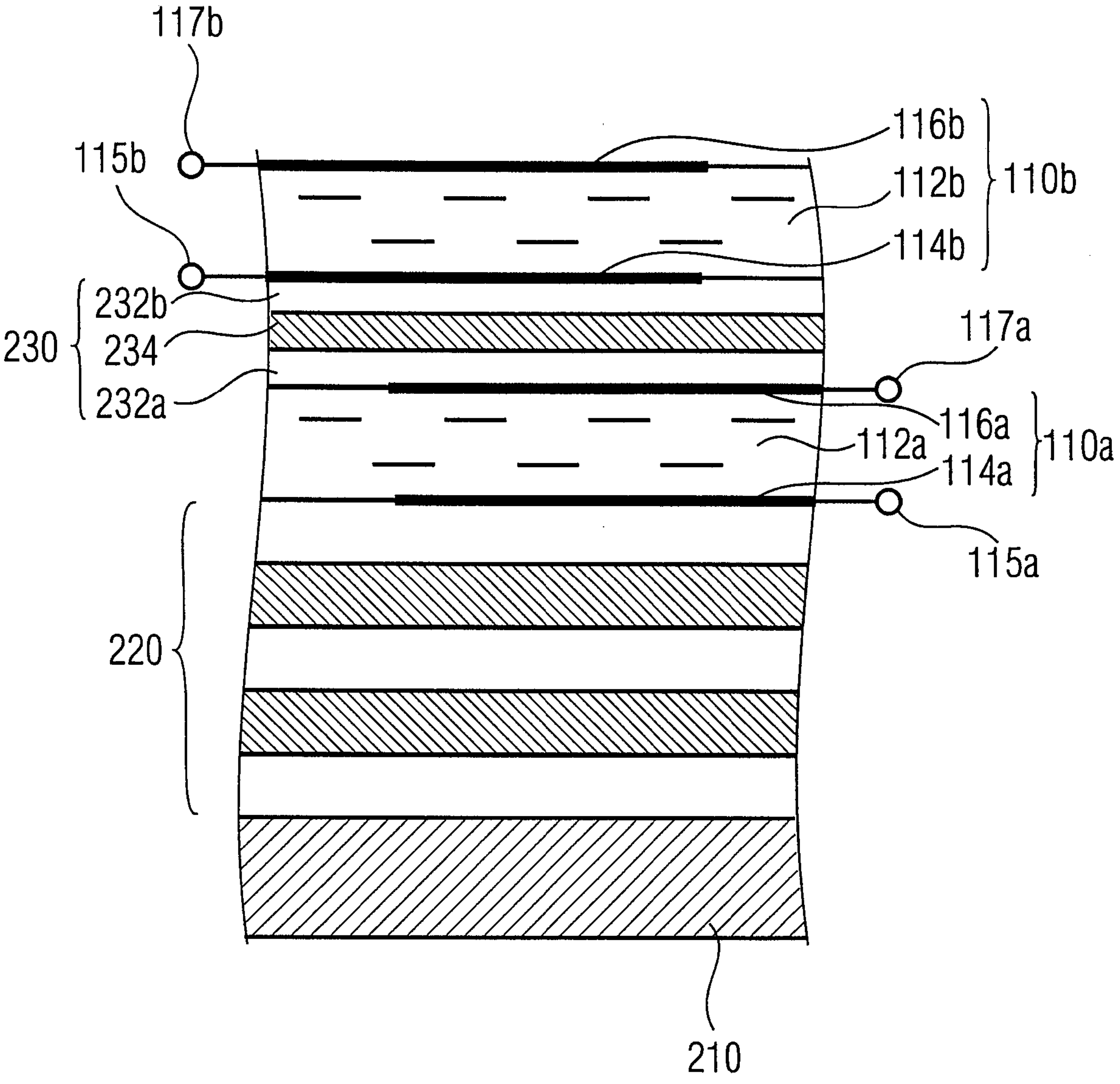
FIGS. 2*a* and 2*b* show a cross-sectional view on a coupled resonator filter and its pass band characteristic.
Figure 2B:
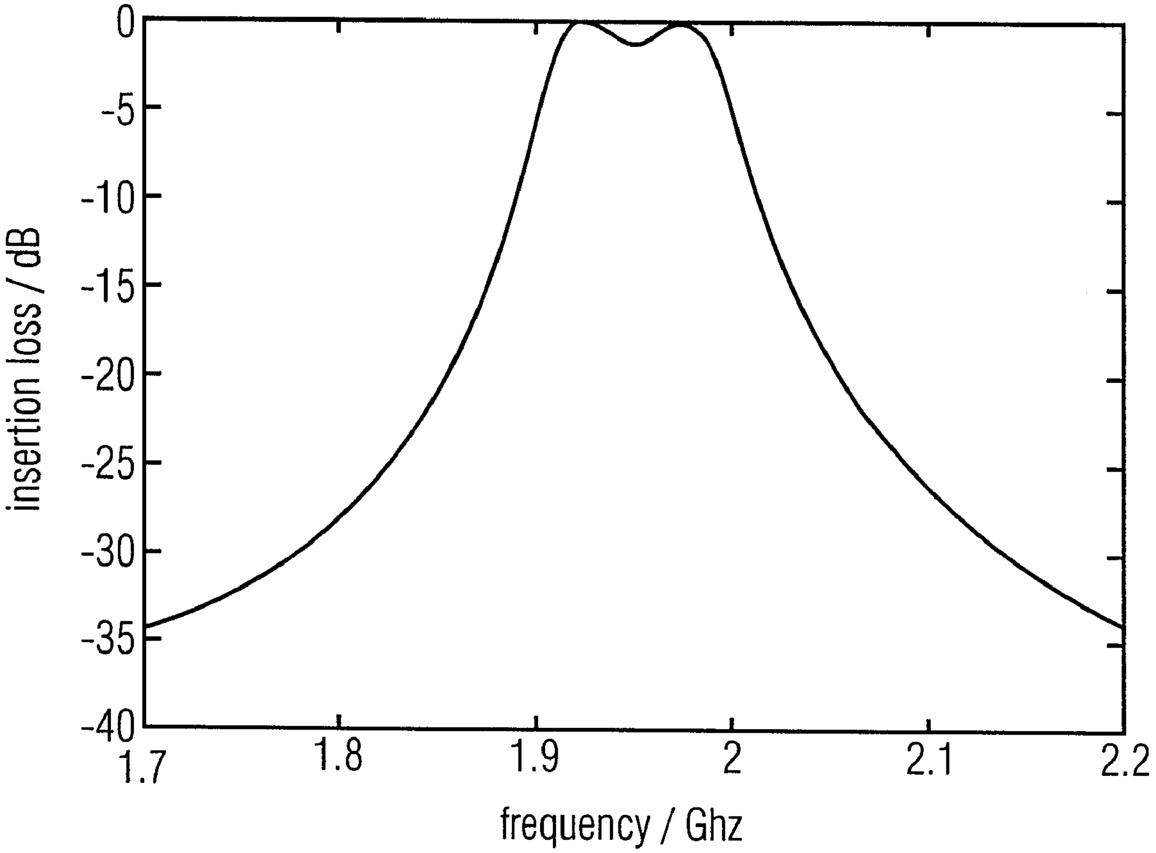

FIG. 2 shows a coupled resonator filter comprising a layer arrangement as shown in FIG. 2*a* and its corresponding characteristic, as shown in FIG. 2*b*. The CRF comprises first and second resonators 110*a*, 110*b*, wherein each resonator comprises a piezoelectric layer 112*a*, 112*b* between a first electrode 114*a*, 114*b* and a second electrode 116*a*, 116*b*. The first resonator 110*a* and the second resonator 110*b* are formed on two opposite sides of a coupling layer 230, which may comprise an assembly of layers of alternating high and low acoustic impedances. As an example, a coupling layer of low acoustic impedance 232*a* is formed at least partially on the first resonator 110*a*, on which a coupling layer of high acoustic impedance 234 is formed at least partially, on which a second coupling layer of low acoustic impedance 232*b* is formed at least partially, on which the first electrode of the second resonator 114*b* is formed at least partially followed by the piezoelectric layer of the second resonator 112*b* and the second electrode of the second resonator 116*b*. The first electrodes 114*a*, 114*b* can, again, comprise first terminals 115*a*, 115*b*, the second electrodes 116*a*, 116*b* may comprise second terminals 117*a*, 117*b*. The CRF can, again, be arranged as a solidly mounted resonator implying that the CRF is formed on a substrate 210 with an acoustic mirror 220. Again, the acoustic mirror 220 has been described in more detail in the context of FIG. 1 and a repeated description is omitted here.

The transfer characteristics of the CRF, as shown in FIG. 2*a*, is displayed in FIG. 2*b*, where an insertion loss (measured, again, in dB) is shown as a function of the frequency as measured in GHz. Starting with low frequencies, the insertion loss is a monotonic increasing function up to a maximum at around 1.93 GHz and a second maximum at around 1.96 GHz. For higher frequencies, the insertion loss is a monotonically decreasing function and the insertion loss remains almost constant between the two maxima (apart from a small minimum at around 1.94 GHz). FIG. 2*b* shows that the CRF exhibits a wide passband behavior, wherein the width of the passband (corresponding to the separation of the two maximums) maybe arranged appropriately by the coupling layer 230 between the first resonator 110*a* and the second resonator 110*b*. The central frequency of this bandpass on the other hand, which is at around 1.94 GHz, may be adapted, for example, by choosing the resonant frequency of the first resonator 110*a* (e.g., by modifying the thickness of its piezoelectric layer 112*a* accordingly).

Figure 3:
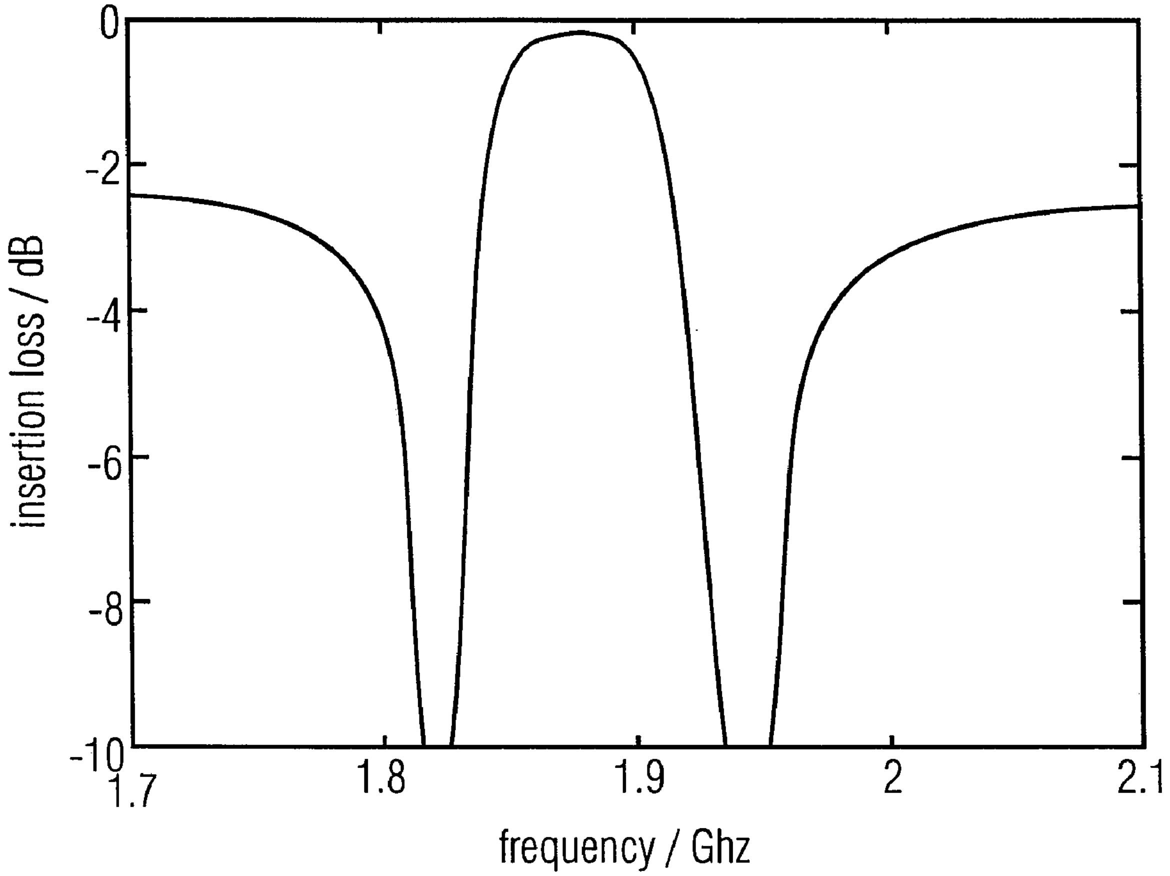
FIG. 3 shows a transfer characteristic of a ladder filter.

FIG. 3 shows a passband response characteristic of the single section of the ladder filter. An insertion loss signal (measured in dB) is shown here as a function of a frequency, as measured in GHz. The insertion loss measures, for example, the energy loss of a signal passing a filter, which in this example, is the ladder filter. Since the insertion loss signal measures an attenuation, a zero-value corresponds to a signal passing the filter without loss. The graph shows that around a central frequency of about 1.89 GHz, the insertion loss exhibits a maximum, around which the signal exhibits almost no loss. This maximum has a certain width, which approximately extends from 1.85 GHz to 1.92 GHz and outside this region the graph falls rapidly to minima, which are at about 1.84 GHz and a second one is at about 1.94 GHz. For frequencies below 1.84 GHz and for frequencies above 1.94 GHz, the graph, again, increases monotonically. This graph shows the characteristics for a single section, whereas multiple sections achieve a desired stop band performance typically by a cascading behavior.

Figure 4:
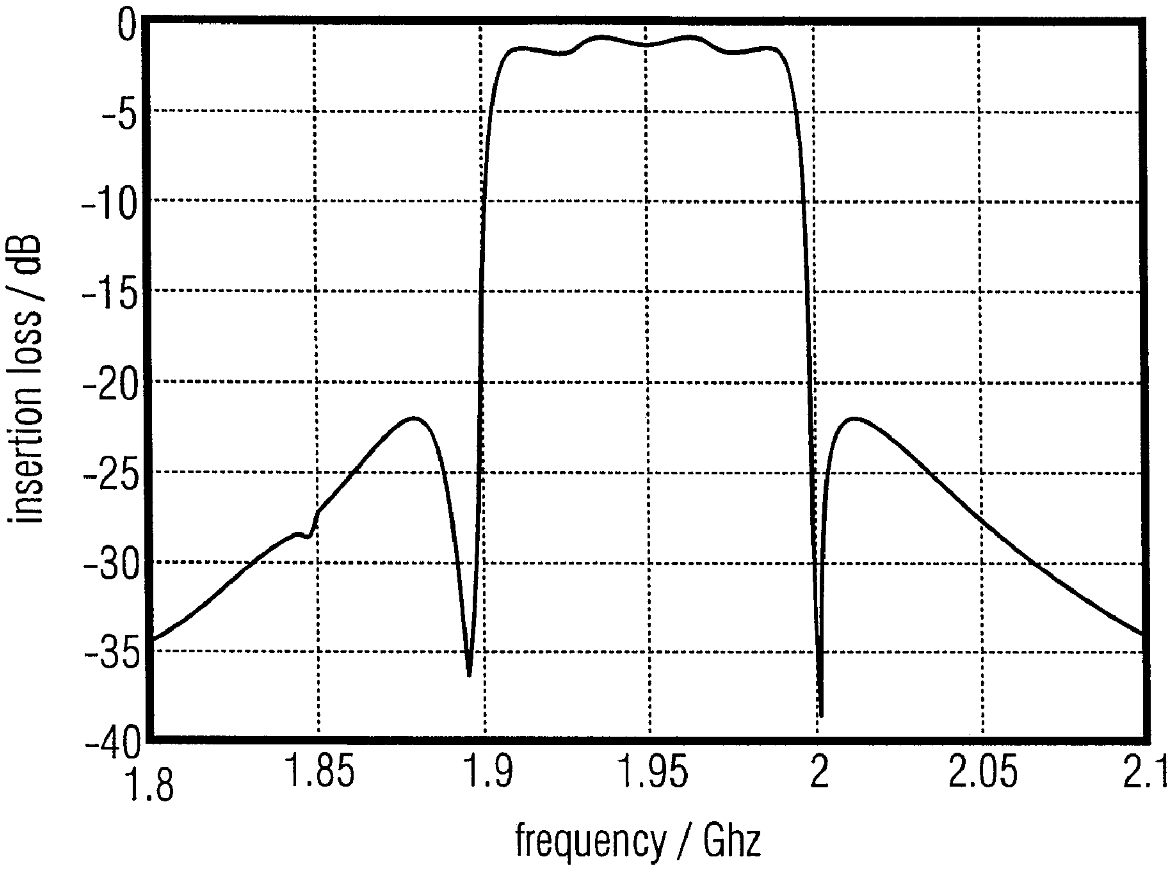
FIG. 4 shows a graph for an insertion loss signal for a combined ladder—coupled resonator filter.

FIG. 4 shows an insertion loss signal (measured in dB) as a function of the frequency (measured in GHz) of the combined ladder—CRF filter. The characteristic shows a pass band in the frequency region between approximately 1.91 and 1.99 GHz. At this frequency region, the transition bands start and the graph in FIG. 4 shows a very steep fall-down—an important benefit of embodiments of the present invention. In the pass band, there is almost no insertion loss (attenuation is almost zero) so that it exhibits very good filter characteristics. This characteristic is only one exemplary possibility for using bulk acoustic wave devices according to embodiments of the present invention and other circuits, which have not been described, can exhibit the same benefits, which are detailed and described here.

Figure 5:
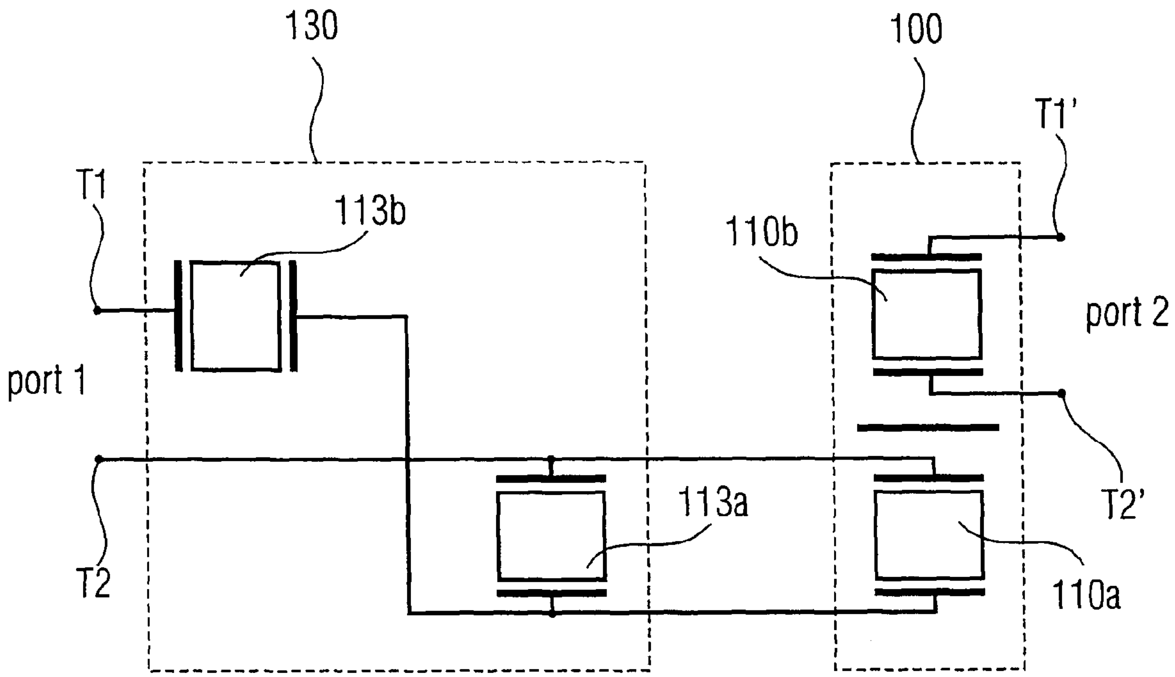
FIG. 5 shows an exemplary circuit for connecting a lower resonator of the coupled resonator filter to a traditional ladder section.

FIG. 5 shows a CRF 100 comprising a stacked arrangement of a first BAW resonator 110*a* and a second BAW resonator 110*b*, a traditional ladder section 130 comprises a first BAW resonator 113*a* and a second BAW resonator 113*b*. The traditional ladder section 130 comprises a port 1 (or first port) with first and second terminals T1, T2-T1 can, for example, comprise a signal in and T2 a ground in line. The first and second BAW resonators 113*a* and 113*b* of the traditional ladder section 130 are electrically connected in series and connect the first and second terminals of port 1. In addition, the first BAW resonator 113*a* is connected in parallel to the first BAW resonator 110*a* of the CRF 100. For this reason, the first BAW resonator 113*a* of the traditional ladder section 130 is also called a shunt resonator and the second BAW resonator 113*b* of the traditional ladder section 130 is also called a series resonator. The second BAW resonator 110*b* of the CRF 100 is acoustically coupled to the first BAW resonator 110*a* of the CRF 100 and is connected to a port 2 (or second port) comprising a first terminal and a second terminal T1' and T2'-T1' can, for example, comprise a signal out and T2' a ground out line. Hence, this is an exemplarily circuit for connecting the lower resonator of the CRF to a traditional ladder section—the circuit comprising a single-to-single filter.

Figure 6:
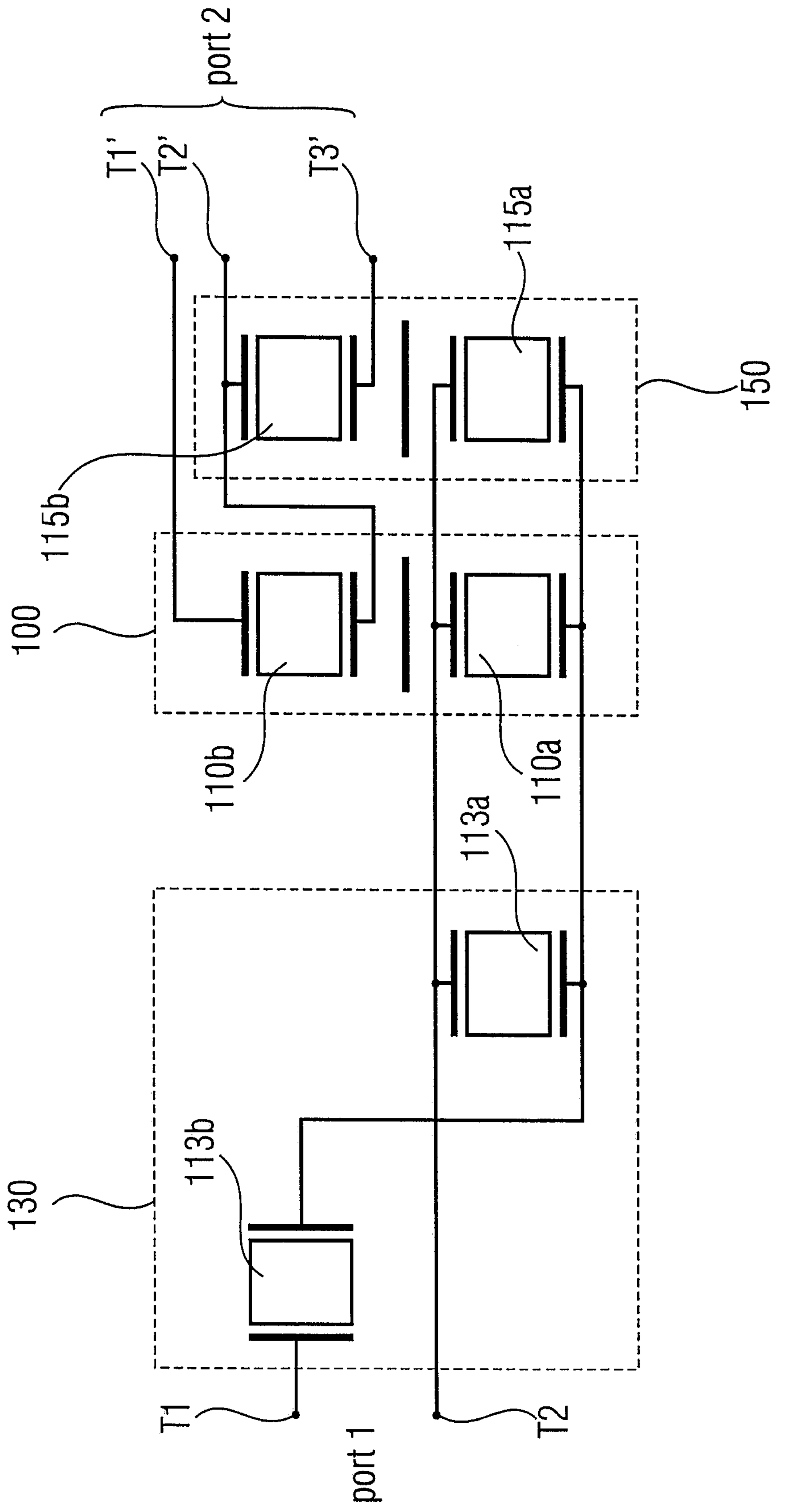
FIG. 6 shows a circuit for a mode converting filter.

FIG. 6 shows a further example for an exemplarily circuit for connecting the resonator of the CRF 100 to the traditional ladder section 130—the further example showing a mode converting filter. In addition to the structure as shown in FIG. 5, the embodiment as shown in FIG. 6 comprises a further CRF 150 with a first BAW resonator 115*a* and a second BAW resonator 115*b*, which are acoustically coupled. The first BAW resonator 115*a* of the further CRF 150 is electrically connected in parallel to the first BAW resonator 110*a* of the CRF 100 and in parallel to the first BAW resonator 113*a* of the traditional ladder section 130.

The second BAW resonator 115*b* of the further CRF 150 comprises a piezo layer that is sandwiched between an upper and a lower electrode, the lower electrode being closer to the first BAW resonator 115*a* and is connected to a third terminal T3'. The upper electrode is connected to the second terminal T2', wherein the first, second and third terminals T1', T2', T3' comprise a port 2. Therefore, the second BAW resonator 110*b* of the CRF 100 is electrically connected in series to the second BAW resonator 115*b* of the further CRF 150—both are connected between the first and third terminals T1' and T3' of port 2.

Therefore, the first and second terminals T1, T2 of port 1 can comprise one signal input terminal (e.g., at the first terminal T1) and one ground input terminal (e.g., at the second terminal T2). The three terminals of port 2 can comprise two signal output terminals (e.g., at the first and third terminals T1' and T3') and one ground output terminal (e.g., the second terminal T2'). Thus, the output signal at the first and third terminals T1' and T3' can relatively be phase shifted by 180°, and hence, provides a balanced output signal. This is, for example, possible if the second BAW resonator 115*b* of the further CRF 150 and the second BAW resonator 110*b* of the CRF 100 are formed at different sites of a common piezolayer, so that the circuitry as explained before, ensures the phase shift by 180°.

The embodiments as shown in FIGS. 5 and 6 can be formed in a way that the BAW resonators 110*a*, 115*a*, 113*a* and 113*b* are formed at different sites of a first piezolayer and the circuitry can be built by an appropriate patterning of the electrodes of the BAW resonators. In the following, three examples will be explained for manufacturing structures as shown in FIGS. 5 and 6 on a common substrate so that a monolithic integration is achieved.

FIGS. 7*a* to 7*g* show a first example for a process flow achieving this monolithic integration of a BAW-CRF device.

Figure 7A:
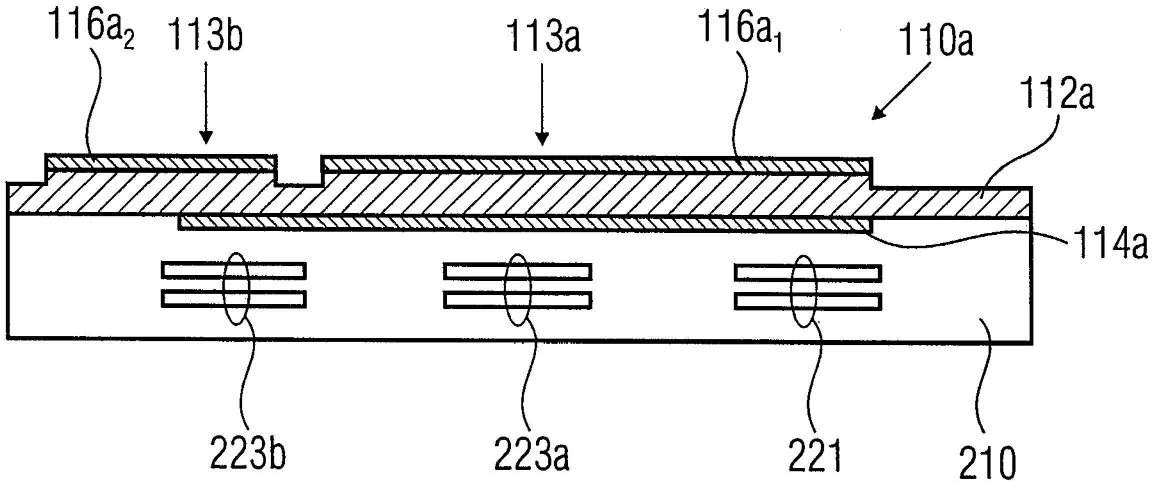
FIGS. 7*a*-7*g* show processing steps for manufacturing a device according to embodiments of the present invention.

FIG. 7*a* shows a starting structure of the process flow, wherein in the substrate 210 an acoustic mirror 221 related to the CRF 100, an acoustic mirror 223*a* related to the first BAW resonator 113*a* and an acoustic mirror 223*b* related to the second BAW resonator 113*b* of the traditional ladder section 130 are formed. Next, on sites of the acoustic mirrors 221, 223*a* and 223*b* a first electrode 114*a* is formed, on which the piezoelectric layer 112*a* is deposited. As the last layer in this assembly the second electrode 116*a* is formed partially on the piezoelectric electric layer 112*a* and patterned in a way that the sites of the CRF 100 and the site of the first BAW resonator 113*a* (the shunt resonator) of the traditional ladder section 130 are connected by a first part 116*a*$_1$ and a second part 116*a*$_2$ is formed at the site of the second BAW resonator 113*b* of the ladder section 130.

Figure 7B:
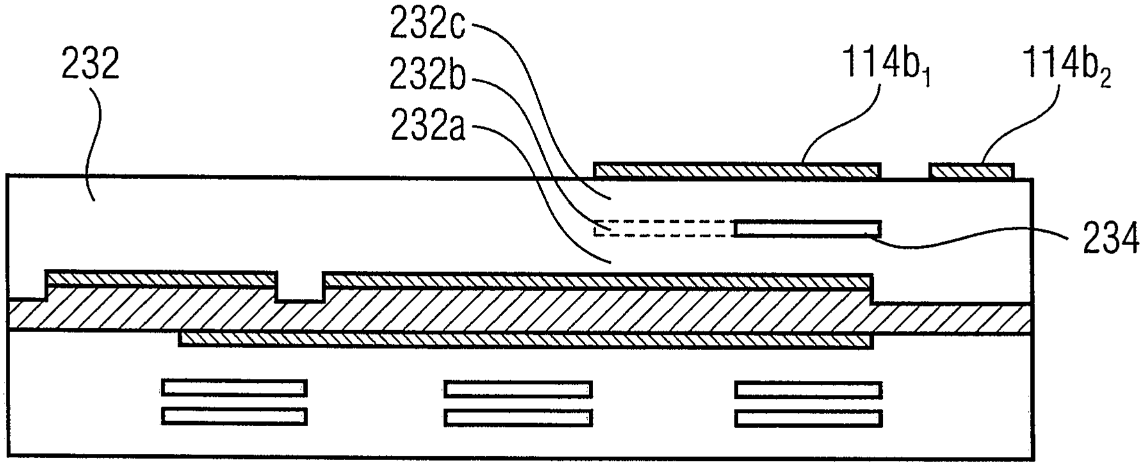

FIG. 7*b* shows the following steps in the process flow. First, a layer of lower acoustic impedance 232 is formed on the structure as shown in FIG. 7*a*, wherein at the site of the CRF 100, a layer of higher acoustic impedances 234 is embedded in the layer of lower acoustic impedances 232. This embedding can, for example, be done in the following way. First, a first part of the layer of lower acoustic impedance 232*a* is deposited, followed by the layer of higher acoustic impendence 234, followed by a second part of the layer of lower acoustic impedances 232*b*. Next, an etching step removes the second part of the layer of lower acoustic impedance 232*b* at the site of the layer of higher acoustic impedance 234 so that a planar surface arises. Finally, a third part of the layer of lower acoustic impedance 232*c* is formed on the second part of the layer with lower acoustic impedance and on the layer with higher acoustic impedance 234. The layer of lower acoustic impedance can comprise for example, silicon oxide ($SiO_2$) and the layer of higher acoustic impedance can, for example, comprise tungsten. To obtain the result as shown in FIG. 7*b*, the first electrode 114*b* of the second BAW resonator 110*b* is formed on the layer with lower acoustic impedance 232 and is pattered so that the first electrode 114*b*$_1$ of the second BAW resonator 110*b* is formed at the site of the CRF 100. In FIG. 7*b* it is also shown that a further part for the electrode 114*b*$_2$ can be left in order to generate later the first terminal T1' (see below). Both electrode parts, 114*b*$_1$ and 114*b*$_2$, can be generated from a single electrode 114*b*, for example, by an etching step.

Hence, FIG. 7*b* shows the situation after the formation of the coupling layers 230 and the bottom electrode (the first electrode 114*b*$_1$) of the top resonator, which were also denoted by BOTE2 of the CRF 100 before.

Figure 7C:
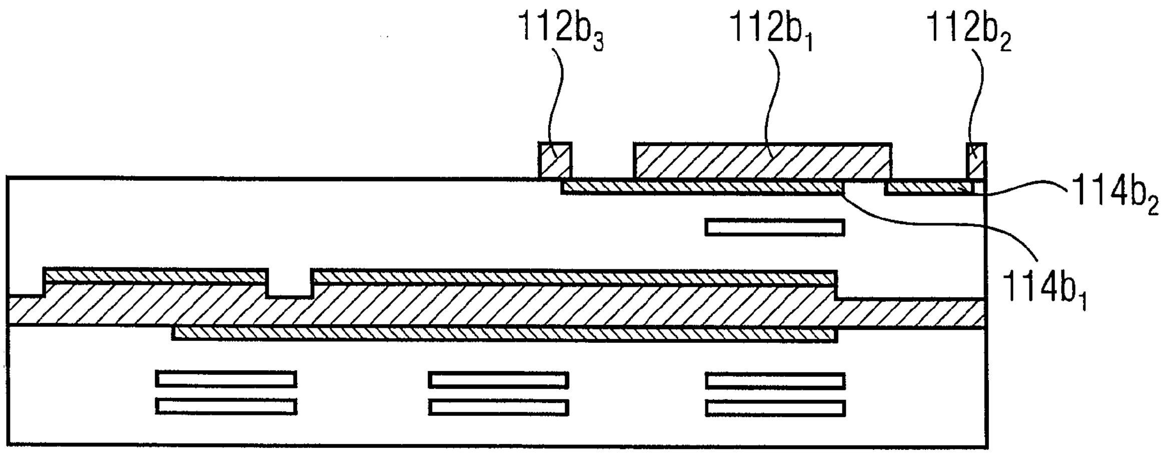

FIG. 7*c* shows the following steps, in which the second piezoelectric layer 112*b* is formed on the first electrodes 114*b* (BOTE2) and patterned so that three parts emerge—a first part 112*b*$_1$ being used as piezoelectric layer of the second BAW resonator 110*b* of the CRF 100, a second part 112*b*$_2$ and a third part 112*b*$_3$. Before forming the piezoelectric layer 112*b* a planarization step should be performed so that the surface on which the piezoelectric layer 112*b* is deposited comprises a planar surface. The planarization can again be done following conventional steps including forming of a planarization layer, followed by an etching step and a polishing step in order to remove narrow fences extending on top of the first electrodes 114*b*.

Figure 7D:
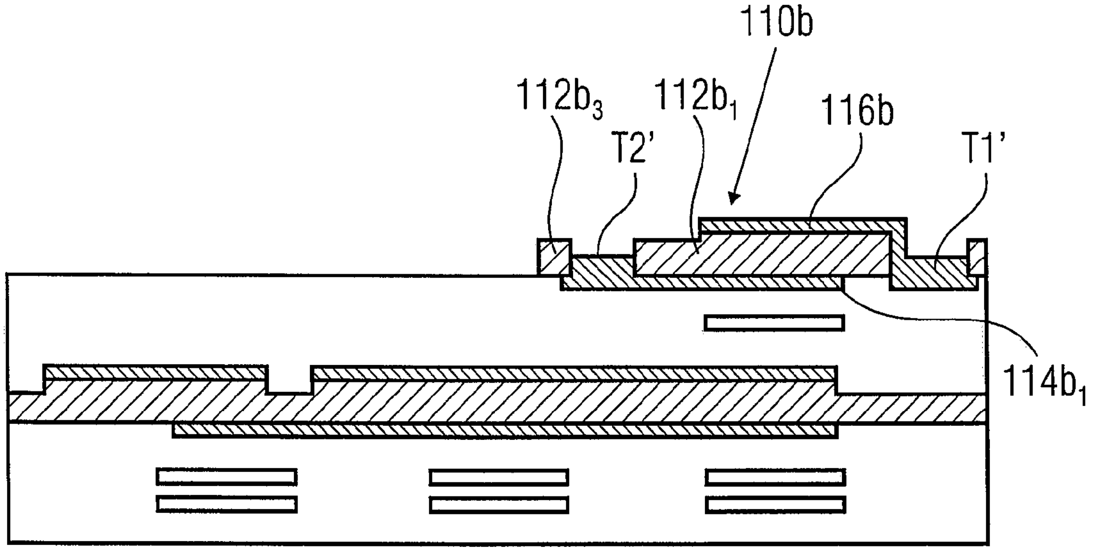

FIG. 7*d* shows the result of the next processing step, at which the second electrode 116*b* of the second BAW resonator 110*b* of the CRF 100 is formed on the first part 112*b*$_1$ of the second piezo layer 112 and on the further part of the electrode 114*b*$_2$ to form the first terminal T1' of port 2. The part of the second piezo layer 112*b* sandwiched between the first electrode 114*b*$_1$ and the second electrode 116*b* comprises the second BAW resonator 110*b* of the CRF 100. The second and third part of the piezo layer 112*b*$_2$ and 112*b*$_3$ are separated by an opening through which the first electrode 114*b*$_1$ is accessible and this opening provides the second terminal T2' of port 2.

Figure 7E:
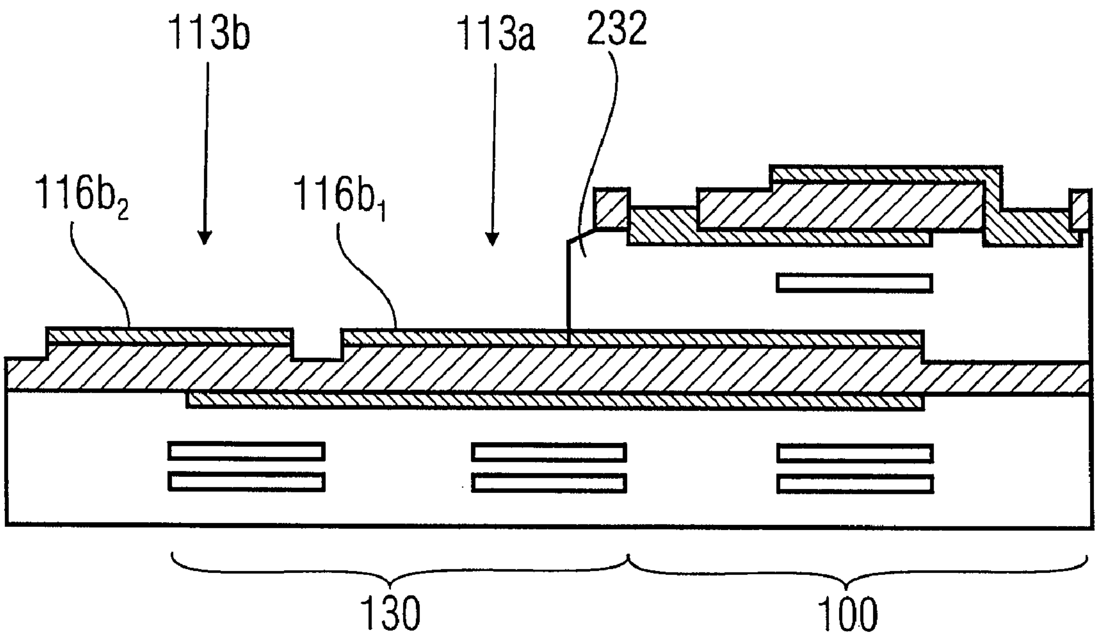

FIG. 7*e* shows the result of the following process step in which the layer of lower acoustic impedance 232 is removed at the site of the first resonator 113*a* of the traditional ladder section as well as at the site of the second resonator 113*b* of the traditional ladder section 130. The removal can be performed, for example, by an etching step that stops on the second electrode parts 116*a*$_1$ and 116*a*$_2$.

Figure 7F:
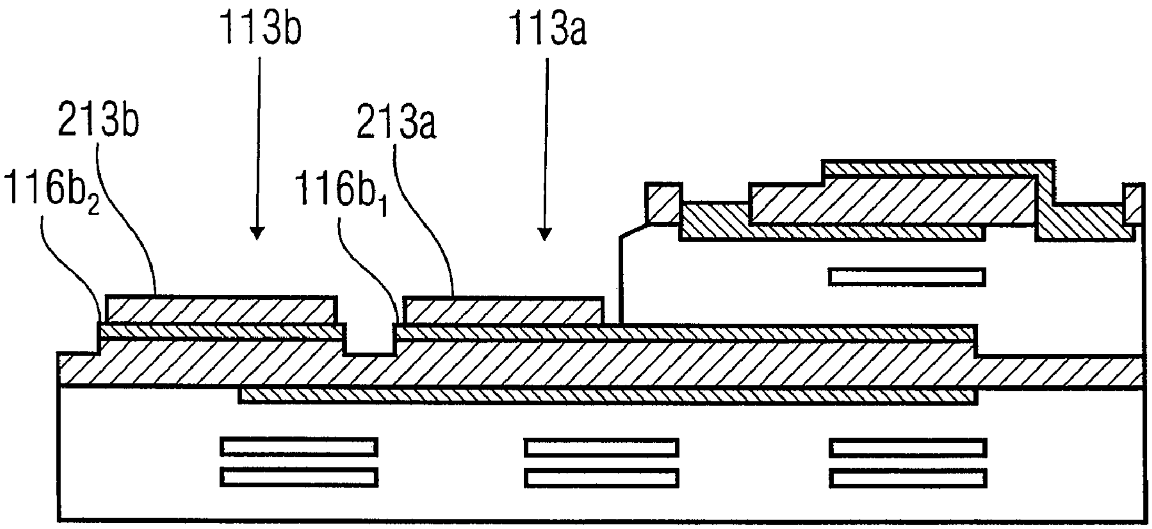

FIG. 7*f* shows the following process steps in which the resonant frequency of the shunt resonator (the first BAW resonator 113*a*) and of the series resonator (the second BAW resonator 113*b*) are shifted or detuned. This can be achieved, for example, by a mass load, which means adding or removing material from these resonators. In the embodiment as shown in FIG. 7*f* this is done by adding a first mass load layer 213*a* to the first part of the second electrode 116*a*$_1$ and by adding a second mass load layer 213*b* to the second part of the second electrode 116*a*$_2$. The thicknesses of the first mass load layer 213*a* and the second mass load layer 213*b* can be adjusted in a way that the resonance frequency of both resonators is shifted appropriately.

FIG. 7*f* shows the additive principle, which means adding additional materials to shift the resonance frequency, but in the same way also removing of material of the second electrode parts 116*a*$_1$ and 116*a*$_2$ shifts the resonance frequency. Depending on the desired result, with adding material or removing material can be performed.

Figure 7G:
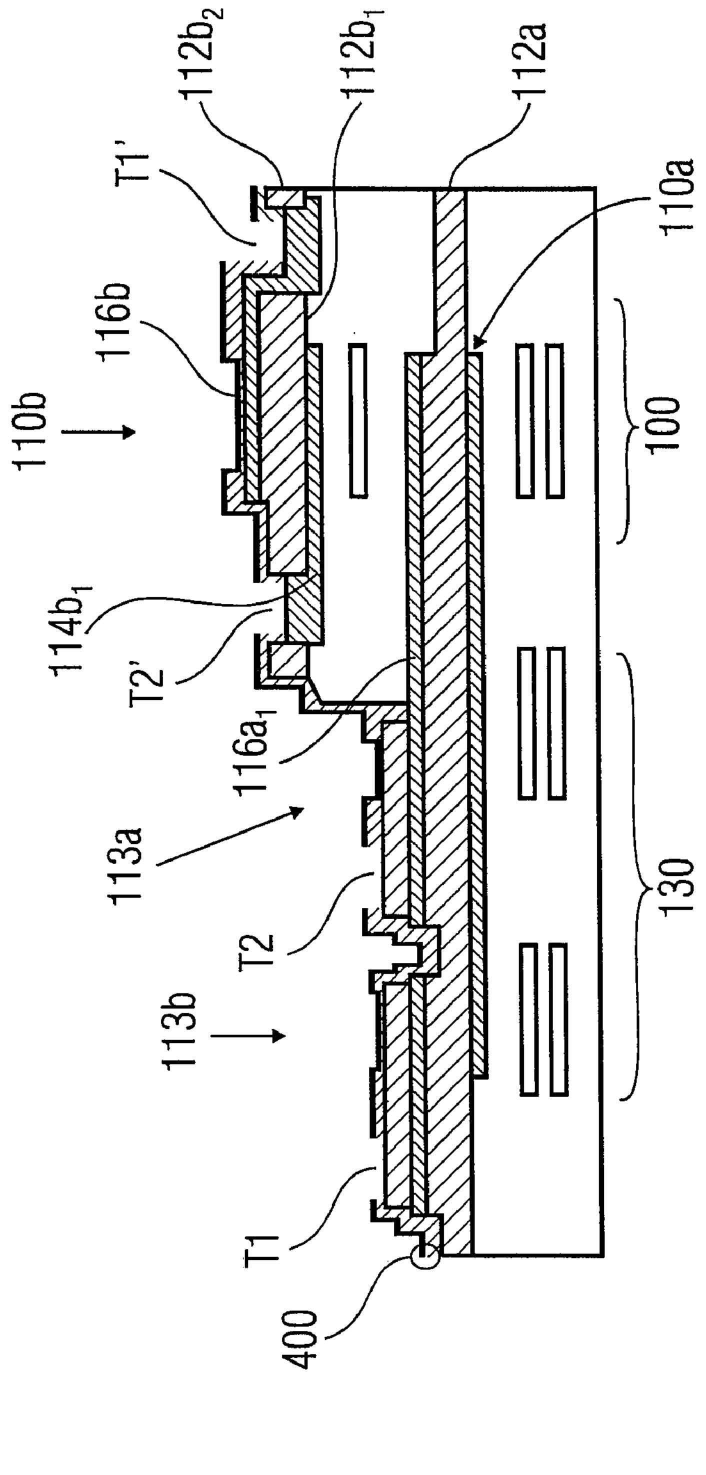

FIG. 7*g* shows the final result of a monolithically manufactured structure comprising the CRF 100 and the traditional ladder section 130 with the circuitry as shown in FIG. 5. As the last step in order to obtain this structure additional layers 400 are formed on the structure as shown in FIG. 7*f*. The additional layers 400 can comprise layers for controlling so-called spurious modes and in addition, comprise passivation layers. The additional layers 400 comprise openings for the first and second terminals T1, T2 of port 1 and for the first and second terminals T1', T2' of port 2, wherein the additional layers 400 for controlling the spurious modes can be formed, for example, at intermediate sites, where no BAW resonator is formed on the substrate and can also cover the site walls of the piezolayers 112*a* and 112*b*.

By extending this structure as shown in FIG. 7*g*, by using the third part of the second piezoelectric layer 112*b*$_2$, it is also possible to obtain a monolithically integrated device for the circuitry as shown in FIG. 6. The corresponding processing steps are the same as the one explained in connection with FIGS. 7*a* to 7*g* and a repeated description is omitted here.

In further embodiments it is possible before adding the additional layers 400 to add a further metal layer in order to connect the second electrodes 116*a*$_1$ or the first BAW resonators 110*a*, 113*a* or of the second BAW resonator 113*b* to the first or second electrode 114*b*$_1$ or 116*b* of the second BAW resonator 110*b* of the CRF 100. This additional layer can, however, be omitted by following the following processing steps.

Figure 8A:
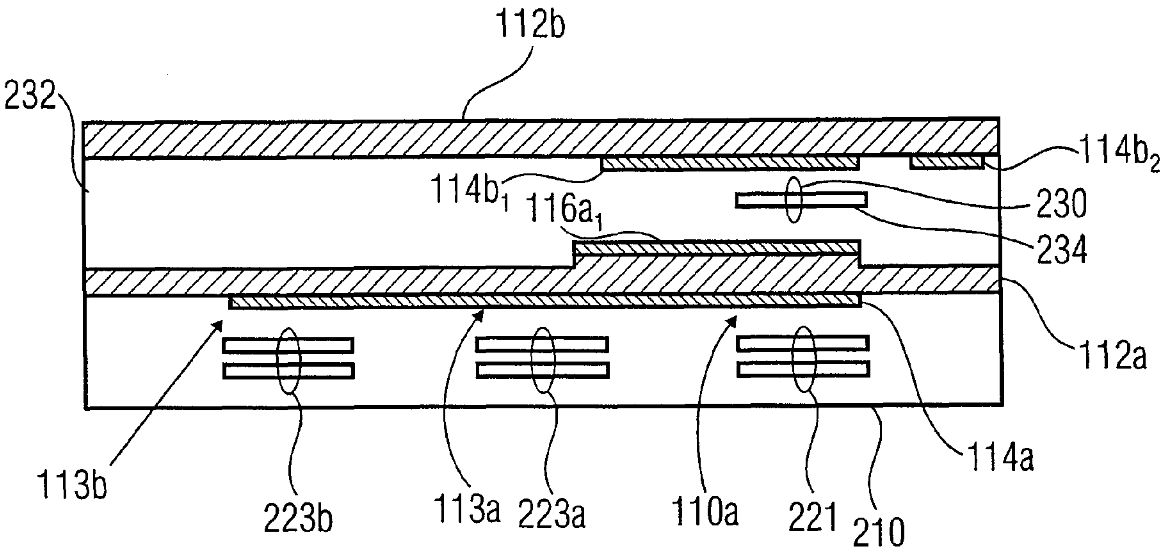
FIGS. 8*a*-8*c* show processing steps for manufacturing a further device according to a further embodiment.
Figure 8B:
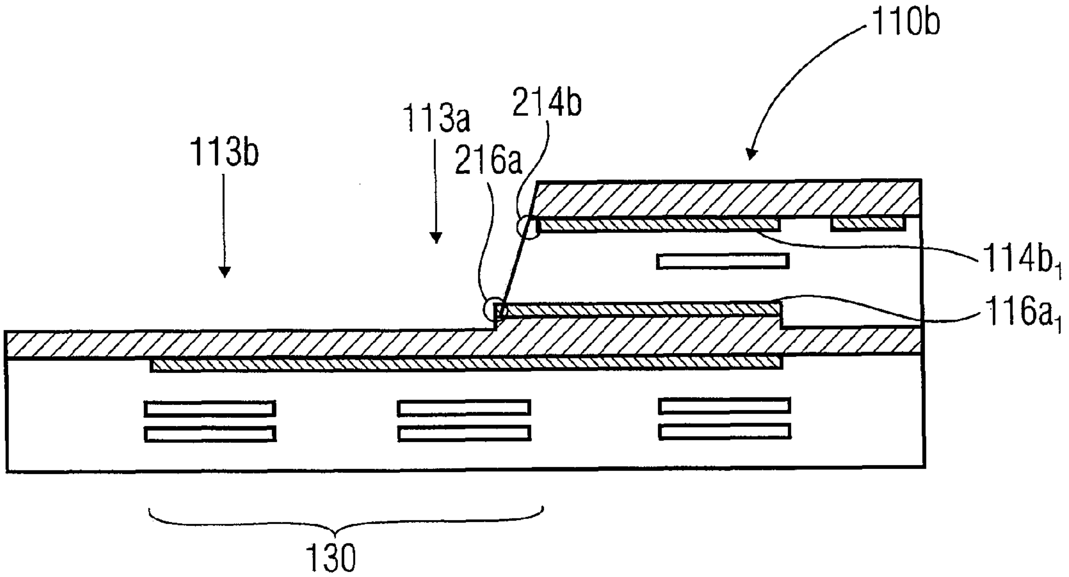
Figure 8C:
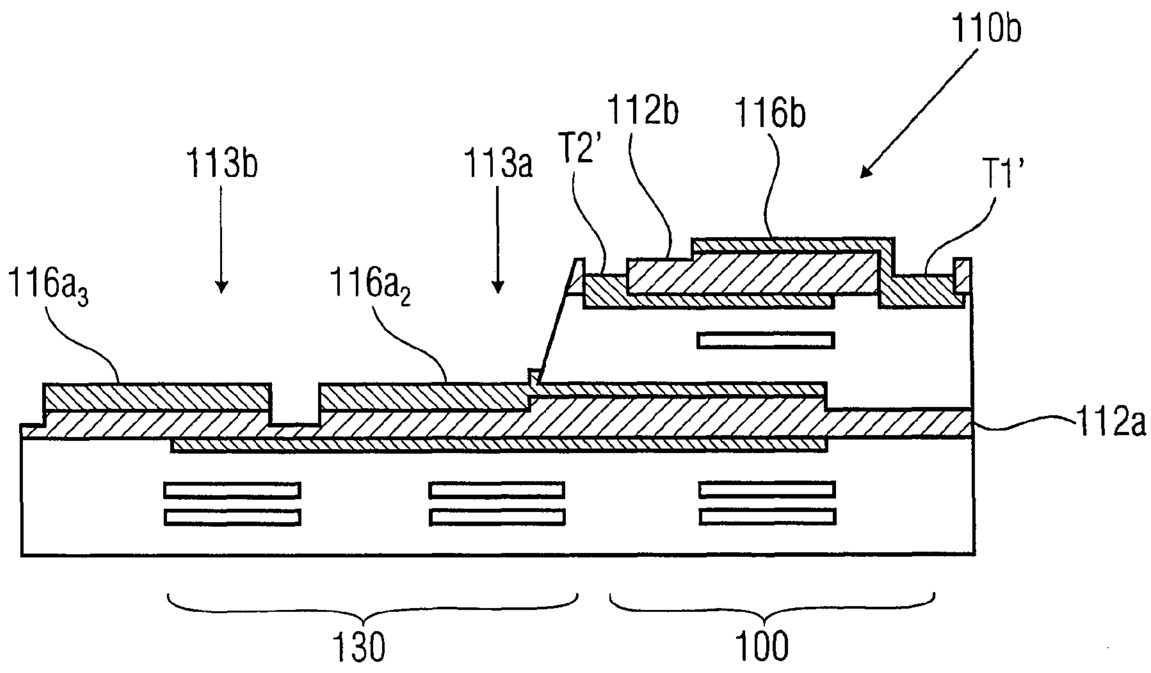

FIGS. 8*a* to 8*c* show a second example of a processing flow in order to achieve a monolithically integrated device for a built CRF 100 and a conventional ladder type filter 130.

FIG. 8*a* shows a starting point for a further processing flow, it comprises the substrate 210 with a first acoustic mirror 221, a second acoustic mirror 223*a* and a third acoustic mirror 223*b*. The first acoustic mirror is formed at the site of the CRF 100, the second acoustic mirror 223*a* is formed at the site of the shunt resonator 113*a* and the third acoustic mirror 223*b* is formed at the site of the series resonator 113*b*. The starting structure as shown in FIG. 8*a* comprises the first piezoelectric layer 112*a* and the second piezoelectric layer 112*b*. Between the first piezoelectric layer 112*a* and the second piezoelectric layer 112*b*, a layer of lower acoustic impendence 232 is formed. At the sites of the first BAW resonator 110*a* of the CRF 100 and at the site of the first BAW resonator 113*a* and of the second BAW resonator 113*b* of the traditional ladder section 130 between the first piezoelectric layer 112*a* and the substrate 210 with the acoustic mirrors, a lower bottom electrode 114*a* is formed. In addition, at the site of the CRF 100 between the first piezoelectric layer 112*a* and the second piezoelectric layer 112*b* the acoustic coupling layer 230 is formed, which comprises a layer assembly of alternating high and low acoustic impedance materials, which means, for example, a layer of low acoustic impedance 232*a*, followed by a layer of higher acoustic impedance 234, followed by a further layer of lower acoustic impedance 232*b*. Furthermore, at the site of the CRF 100, the first piezoelectric layer 112*a* is sandwiched between the first electrode 114*a* and a second electrode 116*a* (the lower top electrode TOPE1), and the second piezoelectric layer 112*b* is formed at the site of the CRF 100 on a first electrode 114$b_1$ (an upper bottom electrode BOTE2). The upper bottom electrode 114*b*, as shown in FIG. 8*a* comprises two pieces, the first electrode 114$b_1$ and the second part of the first electrode 114$b_2$, which are disconnected, for example due to a patterning.

FIG. 8*b* shows the following processing steps, in which, instead of depositing the second electrode 116*b* or an upper top electrode TOPE2, an etching step is performed in order to remove the layer of low acoustic impedance 232 on top of the first and second BAW resonators 113*a* and 113*b* of the traditional ladder section 130. Optionally, this etching step can be performed in a way that an opening 216*a* of the second electrode of the first resonator 116*a* and/or an opening 214*b* to the first electrode 114*b*, of the second BAW resonator 110*b* of the CRF 100 emerges.

FIG. 8*c* shows the following processing steps in which at first the second piezoelectric layer 112*b* is structured in order to obtain openings for the first and second terminal T1', T2' of port 2. Moreover, the second electrodes 116$a_2$ and 116$a_3$ of the first and second BAW resonators 113*a* and 113*b* are formed on the first piezoelectric layer 112*a* and at the same time the second electrode 116*b* of the second BAW resonator 110*b* of the CRF 100 is formed (for example, by the same layer deposited on the structure as shown in FIG. 8*b*). As a next step, the deposited layer is patterned in a way that as shown in FIG. 8*c*, the second part of the second electrode 116$a_2$ is connected to the first part of the second electrode 116$a_1$ of the first BAW resonator 110*b* or the CRF 100 and moreover, the patterning is done in a way that the third part of the second electrode 116$a_3$ is disconnected from the second electrode 116$a_2$ of the second BAW resonator 113*a* of the traditional ladder section 130. The etching step as shown in FIG. 8*c* has removed the connection between the top electrode 116*a* to the top electrode 116*b* (not shown in the figure), but as different embodiments, this connection can remain. In this embodiment the second piezoelectric layer 112*b* may be opened at a different place in order to provide a second terminal of port 2.

The following processing steps in order to achieve the final monolithically integrated structure can be done in the same way as has been explained in connection with FIGS. 7*f* and 7*g*.

Figure 9A:
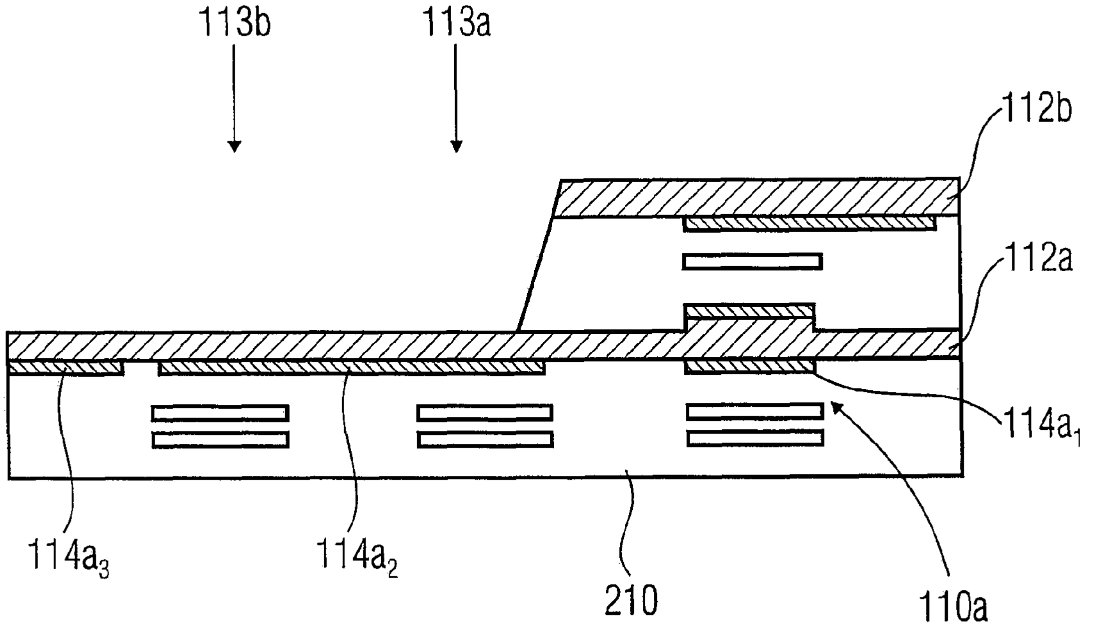
FIGS. 9*a* and 9*b* show processing steps for manufacturing a device according to another embodiment.
Figure 9B:
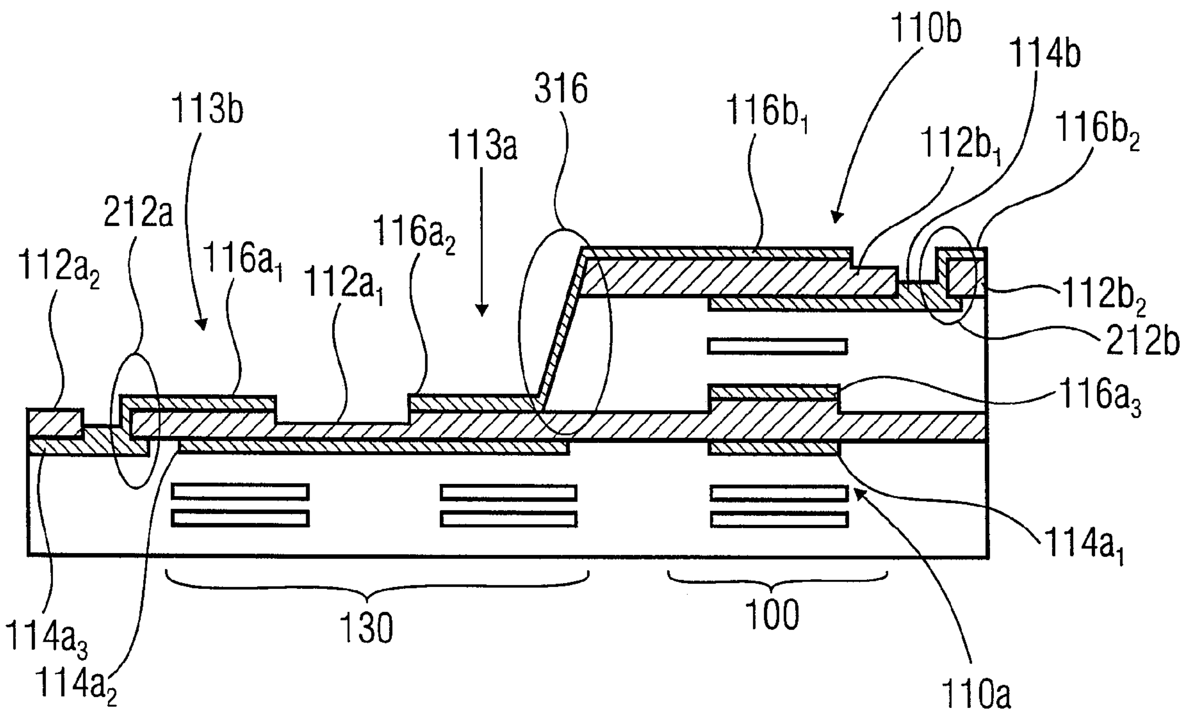

FIGS. 9*a* and 9*b* show yet another possible process flow, which offers even more functionality. The starting point is now the structure as shown in FIG. 8*b* with the difference that the first electrodes 114$a_1$ . . . 114$a_3$ are structured in a way that a first part 114$a_1$ is formed between the first piezoelectric layer 112*a* and the substrate 210 at the site of the first BAW resonator 110*a* of the CRF 100, a second part 114$a_2$ is formed at the sites of the first and second BAW resonator 113*a* and 113*b*, which are both electrically connected, and a third part of the first electrode 114$a_3$ is electrically disconnected from the first electrode 114$a_2$.

In a next step, both piezolayers, first piezolayer 112*a* and second piezolayer 112*b*, are patterned and the top electrodes 116*b* and 116$a_1$, 116$a_2$ are deposited and formed simultaneously on the upper resonator (the second resonator 110*b*) of the CRF 100 and on the first and second BAW resonators 113*a* and 113*b* of the traditional ladder 130.

FIG. 9*b* shows a few combinations of connections, but evidently with additional vias 212 through the piezoelectric layer(s) making connections of electrodes possible. Therefore, any topology having traditional resonators and CRFs are possible.

The embodiment as shown in FIG. 9*b*, the first piezoelectric layer 112*a* comprises an opening 212*a*, through which the first part of the second electrode 116$a_1$ is connected with a third part of the first electrode 114$a_3$ (or a further electrode). In addition, the second piezoelectric layer 112*b* comprises an opening 212*b* through which the first electrode 114*b* of the second BAW resonator 110*b* of the CRF 100 is connected with the second part of the second electrode 116$b_2$ (or an additional electrode) of the further BAW resonator (not shown in FIG. 9*b*). In addition, the first electrode 114*a* is structured in a way that three parts emerge, a first part 114$a_1$, and a second part 114$a_2$ and a third part 114$a_3$. Also the second electrode 116*a* is patterned in a way that three parts emerge, a first part 116$a_1$, a second part 116$a_2$ and a third part 116$a_3$. The second electrode 116*b* of the second BAW resonator 110*b* is patterned in a way that two parts emerge, a first part 116$b_1$ and a second part 116$b_2$. At the site of the first BAW resonator 110*a*, the first piezoelectric layer 112*a* is sandwiched between the first part of the first electrode 114$a_1$ and the third part of the second electrode 116$a_3$. At the site of the first BAW resonator 113*a*, the piezoelectric layer 112*a* is sandwiched between the second part of the first electrode 114$a_2$ and the second part of the second electrode 116$a_2$. At the site of the second BAW resonator 113*b*, the first piezoelectric layer 112*a* is sandwiched between the second part of the first electrode 114$a_2$ and the first part of the second electrode 116$a_1$. At the site of the second BAW resonator 110*b* of the CRF 100, the first part of the second piezolayer 112$b_1$ is sandwiched between the first electrode 114*b* and the first part of the second electrode 116*b*1. The deposition of the second electrodes 116*a*, 116*b* can be done in a way that the second part of the second electrode 116$a_2$ is connected to the first part of the second electrode 116$b_1$, as shown in the region 316. In this embodiment, the second electrodes 116*a*, 116*b* can be formed by depositing a single layer followed by a structuring.

Since the first piezoelectric layer becomes accessible during the process flow in the embodiments of FIGS. 9*a* and 9*b* the openings 212*a*, 212*b* of the first piezoelectric layer 112*a* and the second piezoelectric layer 122*b* can be formed within one process step by using a corresponding mask. Also connecting the additional electrode 116$b_2$ with the first electrode 114*b* through the opening 212*b* can be combined within the same process step of connecting the second electrode 116$a_1$ with the further electrode 114$a_3$ through the opening 212*a*. There are no additional process steps needed. This is a major advantage in comparison to conventional methods comprising only openings of the second piezoelectric layer—the first piezoelectric layer (the lower one) is not easily accessible in conventional methods.

Therefore, in the embodiment of FIGS. 9*a* and 9*b*, it is possible to connect the first (or lower) electrodes 114 of one BAW resonator with a second (or upper) electrode 116 of another BAW resonator, which is formed at a different site of the piezoelectric layer 112. It is also possible to connect second electrodes 116*b* of the second BAW resonator 110*b* of the CRF 100 and second electrodes 116*a* of the traditional BAW resonators 113*a* and/or BAW resonator 113*b* of the traditional ladder section 130. Other possibilities comprise electric connections between the first electrodes 114*a*, or parts of the first electrode 114$a_i$ (i=1,2, . . . ), to first electrodes 114*b* of the second BAW resonator 110*b* of the CRF 100 (e.g., by openings as the opening 214*b* shown in FIG. 8*b*); and electric connections between the first electrodes 114*a* (of parts of them) of the BAW resonators 113*a* and 113*b* of the traditional ladder filter section 130 to the second electrodes 116*b* or parts of the second electrodes 116$b_i$ of the second BAW resonator 110*b* (e.g., using openings as the opening 212*a*), but also connections between the second electrodes 116*a* or parts of the second electrodes 116$a_i$ to the first electrodes 114*b* or a part of the first electrodes 114$b_i$ of the second BAW resonator 110*b* (e.g., using openings 216*a*, 214*b* as shown in FIG. 8*b*).

What is claimed is:

1. A coupled resonator filter device, comprising:

a substrate;

a coupled resonator filter comprising a first bulk acoustic wave (BAW) resonator, a second BAW resonator and an acoustic coupling layer disposed between the first BAW resonator and the second BAW resonator, the second BAW resonator comprising a second port with a first terminal and a second terminal; and a filter section comprising a BAW resonator electrically connecting the first BAW resonator of the coupled resonator filter with a first terminal and a second terminal of a first port, wherein the first and second BAW resonators of the coupled resonator filter are acoustically coupled and the first BAW resonator of the coupled resonator filter and the BAW resonator of the filter section are arranged at different sites of a piezoelectric layer.

2. The coupled resonator filter device according to claim 1, wherein the first BAW resonator of the coupled resonator filter is formed between the substrate and the second BAW resonator of the coupled resonator filter.

3. The coupled resonator filter device according to claim 1, wherein the filter section comprises: a shunt resonator and a series resonator, wherein the shunt resonator is connected in parallel to the first BAW resonator of the coupled resonator filter and the series resonator is connected in series between the first terminal of the first port and one of the electrodes of the first BAW resonator of coupled resonator filter.

4. The coupled resonator filter device according to claim 3, further comprising: a further coupled resonator filter comprising a first BAW resonator and a second BAW resonator, which are acoustically coupled, wherein the first BAW resonator of the further coupled resonator filter is formed between the second BAW resonator of the further coupled resonator filter and the substrate and is electrically connected in parallel to the first BAW resonator of the coupled resonator filter, and wherein the second port further comprises a third terminal and the second BAW resonator of the further coupled resonator filter is electrically connected in series between the second and third terminals of the second port.

5. The coupled resonator filter device according to claim 4, wherein the second terminal of the second port comprises a ground output, and wherein the first and the third terminals of the second port comprise a signal output so that an output signal of the first terminal is phase shifted by 180° to an output signal at the third terminal of the second port and the output signal at the second port comprises a balanced output signal.

6. The coupled resonator filter device according to claim 5, wherein in operation the coupled resonator filter device performs a single-to-balanced mode conversion for signals from the first port to the second port.

7. The coupled resonator filter device according to claim 1, wherein the substrate comprises acoustical mirrors at sites, where the first BAW resonator of the coupled resonator filter is formed and where the BAW resonator of the filter section is formed, the acoustical mirrors comprising a layer assembly of alternating materials of high and low acoustic impedances, and wherein the first and second BAW resonators of the coupled resonator filter are acoustically coupled by a further layer assembly of coupling layers of alternating high and low acoustic impedances.

8. The coupled resonator filter device as claimed in claim 1, wherein the acoustic coupling layer comprises a low acoustic impedance layer and a high acoustic impedance layer.

* * * * *